(12) United States Patent
Wang

(10) Patent No.: US 7,889,010 B2
(45) Date of Patent: Feb. 15, 2011

(54) COMPENSATION CIRCUIT

(75) Inventor: Zhao Wang, Beijing (CN)

(73) Assignees: Vimicro Corporation, Beijing (CN); Wuxi Vimicro Corporation, Jiangju (CN)

( * ) Notice: Subject to any disclaimer, the term of this patent is extended or adjusted under 35 U.S.C. 154(b) by 96 days.

(21) Appl. No.: 12/475,522

(22) Filed: May 31, 2009

(65) Prior Publication Data

US 2010/0259237 A1 Oct. 14, 2010

(30) Foreign Application Priority Data

Apr. 14, 2009 (CN) .................... 2009 1 0081864

(51) Int. Cl.
*H03F 1/34* (2006.01)

(52) U.S. Cl. .................................. 330/293; 323/282
(58) Field of Classification Search ......... 330/292–293, 330/252–261; 323/282
See application file for complete search history.

(56) References Cited

U.S. PATENT DOCUMENTS 7,518,428 B2 * 4/2009 Ichiba et al. ................ 327/223

* cited by examiner

*Primary Examiner*—Hieu P Nguyen
(74) *Attorney, Agent, or Firm*—Wuxi Sino IP Agency, Ltd.; Joe Zheng

(57) ABSTRACT

An improved compensation circuit with loop compensation is disclosed. The compensation circuit can get an equivalent large capacitance by amplifying a small capacitor. Hence, the compensation circuit can get a good compensation effect with a minimum chip area, hence lower cost.

10 Claims, 4 Drawing Sheets

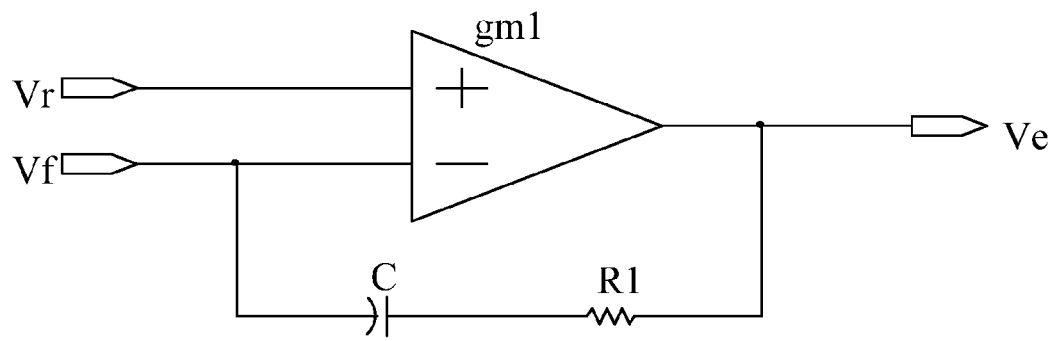
FIG. 1(*prior art*)
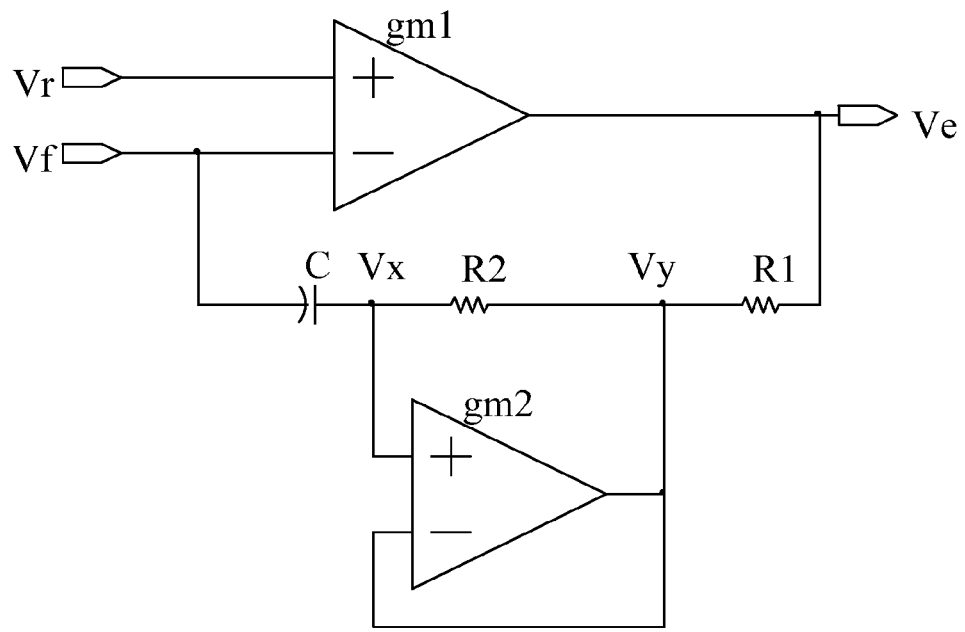
FIG. 2

COMPENSATION CIRCUIT

BACKGROUND OF THE INVENTION

1. Field of the Invention

The present invention relates to techniques for IC design, more particularly to a compensation circuit in a feedback loop.

2. Description of Related Art

Miller compensation is widely used for various loop compensation. FIG. 1 is a circuit diagram 100 showing a normal Miller compensation circuit used in a prior art circuit. Miller compensation circuit comprises a transconductance amplifier gm1, a resistor R1 and a capacitor C. An inverse input of the transconductance amplifier gm1 is coupled to a feedback voltage Vf, a non-inverse input of the transconductance amplifier gm1 is coupled to a reference voltage Vr, and the transconductance amplifier gm1 outputs an error voltage Ve via an output thereof. The resistor R1 is connected with the capacitor C in series. One terminal of the resistor R1 is coupled to the output of the transconductance amplifier gm1, and one terminal of the capacitor C is coupled to the inverse input of the transconductance amplifier gm1. The transfer function of the Miller compensation circuit shown in FIG. 1 is:

$$\frac{Ve}{Vf} = -\frac{gm1 + s \cdot C(R1 \cdot gm1 - 1)}{s \cdot C} \approx -\frac{gm1(1 + s \cdot C \cdot R1)}{s \cdot C}. \quad (1)$$

where "·" means multiplication. If gm1·R1>>1, the above formula (1) is set up approximately. In the formula, gm1 is a transconductance value of the transconductance amplifier gm1, s is a parameter relative to angular frequency, C is a capacitance value of the capacitor C, and R1 is a resistance value of the resistor R1. Hence, the Miller compensation show in FIG. 1 forms a left half-plane zero the frequency of which equals to $$\frac{1}{2\pi \cdot R1 \cdot C}.$$

In many cases, the Miller compensation is desired to form a zero with lower frequency, so the capacitor C with larger capacitance and the resistor R1 with larger resistance are required. For example, it generally requires a 300K ohm resistor of and a 150 pF capacitor to form a compensation zero in some boost power converters. For typical 0.5 micron standard COMS process, the capacitance value of a MOS capacitor with 20 micron length and 20 micron width is about 1 pF. So, the 150 pF capacitor requires 150 number of 20 micron× 20 micron areas. The chip area is greatly increased for obtaining the larger capacitance, even if overall design of system will be affected. Additionally, the compensation effect is not satisfactory if a capacitor with lower capacitance is used.

Thus, improved techniques for improved compensation circuit are desired to overcome the above disadvantages.

SUMMARY OF THE INVENTION

This section is for the purpose of summarizing some aspects of the present invention and to briefly introduce some preferred embodiments. Simplifications or omissions in this section as well as in the abstract or the title of this description may be made to avoid obscuring the purpose of this section, the abstract and the title. Such simplifications or omissions are not intended to limit the scope of the present invention.

In general, the present invention is related to an improved compensation circuit for loop compensation. According to one aspect of the present invention, the compensation circuit can get an equivalent large capacitance by amplifying a small capacitor. Hence, the compensation circuit can get a good compensation effect with a minimum chip area, hence lower cost.

According to one embodiment, the compensation circuit includes a first resistor having one terminal coupled to an output of the first transconductance amplifier; a capacitor connected with the first resistor in series, one terminal of the capacitor coupled to the inverse input of the first transconductance amplifier; a second resistor connected between the first resistor and the capacitor in series; a second transconductance amplifier having an inverse input, a non-inverse input and an output, the inverse input of the second transconductance amplifier coupled to the output of the second transconductance amplifier, the output of the second transconductance amplifier coupled to an intermediate node between the first resistor and the second resistor, and the non-inverse input of the second transconductance amplifier coupled to an intermediate node between the capacitor resistor and the second resistor.

One of the features, benefits and advantages in the present invention is to provide techniques for a compensation circuit that can get an equivalent large capacitance by amplifying a small capacitor. Hence, the compensation circuit can get a good compensation effect with a minimum chip area, thus lower cost.

Other objects, features, and advantages of the present invention will become apparent upon examining the following detailed description of an embodiment thereof, taken in conjunction with the attached drawings.

BRIEF DESCRIPTION OF THE DRAWINGS

These and other features, aspects, and advantages of the present invention will become better understood with regard to the following description, appended claims, and accompanying drawings where:

FIG. 1 is a circuit diagram showing a Miller compensation circuit in the prior art;

FIG. 2 is a circuit diagram showing a compensation circuit according to a first embodiment of the present invention;

DETAILED DESCRIPTION OF THE INVENTION

Figure 3:
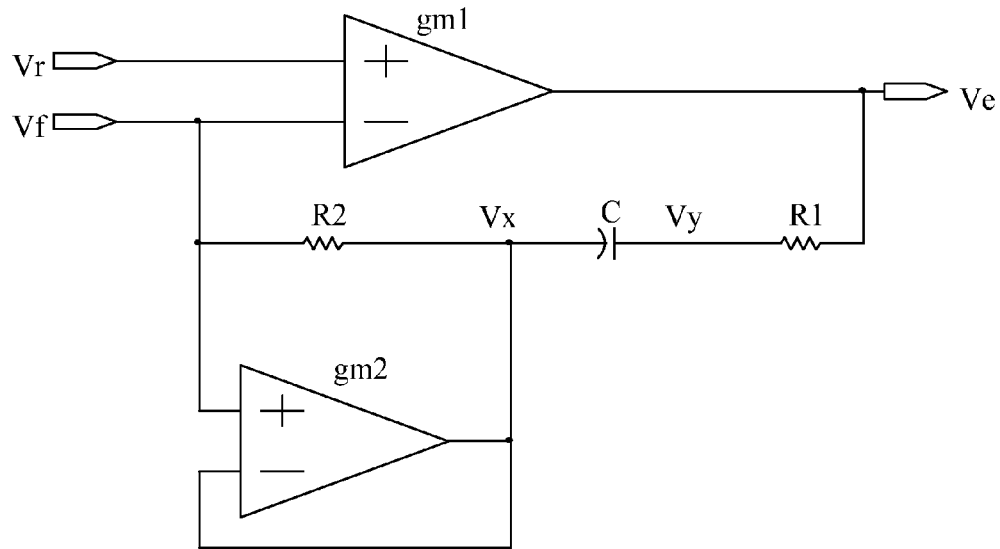
FIG. 3 is a circuit diagram showing a compensation circuit according to a second embodiment of the present invention.

The detailed description of the present invention is presented largely in terms of procedures, steps, logic blocks, processing, or other symbolic representations that directly or indirectly resemble the operations of devices or systems contemplated in the present invention. These descriptions and representations are typically used by those skilled in the art to most effectively convey the substance of their work to others skilled in the art.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams or the use of sequence numbers representing one or more embodiments of the invention do not inherently indicate any particular order nor imply any limitations in the invention.

Embodiments of the present invention are discussed herein with reference to FIGS. 2-6. However, those skilled in the art will readily appreciate that the detailed description given herein with respect to these figures is for explanatory purposes only as the invention extends beyond these limited embodiments.

An improved compensation circuit is provided for loop compensation according to one embodiment of the present invention. In general, the compensation circuit can get an equivalent large capacitance by amplifying a small capacitor. Hence, the compensation circuit can get a good compensation effect with minimum chip area cost.

FIG. 2 is a circuit diagram 200 showing a compensation circuit according to a first embodiment of the present invention. In the first embodiment, the compensation circuit comprises a transconductance amplifier gm1, a resistor R1 and a capacitor C. An inverse input of the transconductance amplifier gm1 is coupled to a feedback voltage Vf, a non-inverse input of the transconductance amplifier gm1 is coupled to a reference voltage Vr, and the transconductance amplifier gm1 outputs an error voltage Ve via an output thereof. The resistor R1 is connected with the capacitor C in series. One terminal of the resistor R1 is coupled to the output of the transconductance amplifier gm1, and one terminal of the capacitor C is coupled to the inverse input of the transconductance amplifier gm1. The compensation circuit further comprises a resistor R2 and a transconductance amplifier gm2. The resistor R2 is connected between the resistor R1 and the capacitor C in series. An output of the transconductance amplifier gm2 is coupled to an intermediate node between the resistor R1 and the resistor R2, an inverse input of the transconductance amplifier gm2 is coupled to the output of transconductance amplifier gm2, and an non-inverse input is coupled to an intermediate node between the capacitor C and the resistor R2.

Relative to the Miller compensation circuit shown in FIG. 1, the resistor R2 and the transconductance amplifier gm2 are added to amply the capacitor C. Specific description for the compensation circuit shown in FIG. 2 is followed hereinafter.

Analyzing the compensation circuit in the first embodiment based on small signal, the following equations are got according to KCL (Kirchhoff's Current Law):

$$-gm1 \cdot Vf = \frac{(Ve - Vy)}{R1};$$

$$\frac{(Ve - Vy)}{R1} + gm2 \cdot (Vx - Vy) = \frac{(Vy - Vx)}{R2};$$

-continued
$$\frac{(Vy - Vx)}{R2} = (Vx - Vf) \cdot s \cdot C.$$

In the above formulas, R1 is a resistance value of the resistor R1, C is a capacitance value of the capacitor C, gm1 is a transconductance value of the transconductance amplifier gm1, gm2 is a transconductance value of the transconductance amplifier gm2, Vf is a small signal voltage of the inverse input voltage of the transconductance amplifier gm1, Ve is a small signal voltage of the output voltage of the transconductance amplifier gm1, Vx is a small signal voltage of the non-inverse input voltage of the transconductance amplifier gm2, Vy is a small signal voltage of the output voltage of the transconductance amplifier gm2, and s is a parameter relative to angular frequency.

Solving the above formulas, the transfer function of the compensation circuit shown in the first embodiment of the present invention is:

$$\frac{Ve}{Vf} = -\frac{gm1 \cdot R1 \cdot gm2 \cdot R2 \cdot s \cdot C + gm1 \cdot R1 \cdot s \cdot C + gm1 \cdot R2 \cdot s \cdot C - gm2 \cdot R2 \cdot s \cdot C - s \cdot C + gm1}{s \cdot C \cdot (1 + gm2 \cdot R2)}. \quad (2)$$

If gm1·R1>>1 and gm2>>1, the above formula (2) is approximated as:

$$\frac{Ve}{Vf} \approx -\frac{gm1 \cdot R1 \cdot gm2 \cdot R2 \cdot s \cdot C + gm1 \cdot R1 \cdot s \cdot C + gm1}{s \cdot C \cdot (1 + gm2 \cdot R2)} = \quad (3)$$

$$-\frac{gm1 \cdot [1 + (1 + gm2 \cdot R2) \cdot C \cdot R1 \cdot s]}{s \cdot C \cdot (1 + gm2 \cdot R2)}.$$

Comparing the transfer function (3) of the compensation circuit shown in FIG. 2 with the transfer function (1) of the Miller compensation circuit shown in FIG. 1, it can be seen that the capacitance value C in the formula (1) is replaced by (1+gm2·R2)·C, that is equivalent to amplify the capacitor C by (1+gm2·R2) times.

For example, provided that gm2=7×10⁻⁵A/V, R2=100KΩ in practical application, so the capacitor C is amplified by 8 times. As a result, the compensation effect of a 20 pF capacitor in the present invention is equivalent to that of a 160 pF capacitor in the prior art. For 0.5 micron standard CMOS process, the 160 pF capacitor occupies the chip area of 20 um×20 um×160, and the 20 pF capacitor only occupies the chip area of 20 um×20 um×20. Although the resistor R2 and the transconductance amplifier gm2 is added to the compensation circuit, the resistor R2 and the transconductance amplifier gm2 occupy very small chip area. Hence, the chip area is saved significantly in overall. In one word, the compensation circuit can get a good compensation effect with minimum chip area cost.

FIG. 3 is a circuit diagram showing the compensation circuit according to a second embodiment of the present invention. The compensation circuit in the second embodiment is identical with that in the first embodiment except for the connection relation of the resistor R1, the resistor R2, the transconductance amplifier gm2, and the capacitor C. In the second embodiment, the resistor R2, the capacitor C and the resistor R are orderly connected in series. One terminal of the resistor R1 is coupled to the output of the transconductance amplifier gm1, and one terminal of the resistor R2 is coupled to the inverse input of the transconductance amplifier gm1. An output of the transconductance amplifier gm2 is coupled to an intermediate node between the capacitor C and the resistor R2, an inverse input of the transconductance amplifier gm2 is coupled to the output of transconductance amplifier gm2, and an non-inverse input is coupled to the inverse input of the transconductance amplifier gm1.

Analyzing the compensation circuit in the second embodiment based on small signal, the following equations are got according to KCL (Kirchhoff's Current Law):

$$-gm1 \cdot Vf = \frac{(Ve - Vy)}{R1};$$

$$\frac{(Ve - Vy)}{R1} = (Vy - Vx) \cdot s \cdot C;$$

$$(Vy - Vx) \cdot s \cdot C + gm2 \cdot (Vf - Vx) = \frac{(Vx - Vf)}{R2}.$$

Solving the above formulas, the transfer function of the compensation circuit shown in the second embodiment of the present invention is:

$$\frac{Ve}{Vf} = -\frac{gm1 \cdot R1 \cdot gm2 \cdot R2 \cdot s \cdot C + gm1 \cdot R1 \cdot s \cdot C + gm1 \cdot R2 \cdot s \cdot C - gm2 \cdot R2 \cdot s \cdot C - s \cdot C + gm1}{s \cdot C \cdot (1 + gm2 \cdot R2)}. \quad (4)$$

If gm1·R1>>1 and gm2>>1, the above formula (4) is approximated as:

$$\frac{Ve}{Vf} \approx -\frac{gm1 \cdot R1 \cdot gm2 \cdot R2 \cdot s \cdot C + gm1 \cdot R1 \cdot s \cdot C + gm1}{s \cdot C \cdot (1 + gm2 \cdot R2)} = \quad (5)$$

$$-\frac{gm1 \cdot [1 + (1 + gm2 \cdot R2) \cdot C \cdot R1 \cdot s]}{s \cdot C \cdot (1 + gm2 \cdot R2)}.$$

Comparing the transfer function (5) of the compensation circuit shown in FIG. 3 with the transfer function (1) of the Miller compensation circuit shown in FIG. 1, it can be seen that the capacitance value C in the formula (1) is also replaced by (1+gm2·R2)·C, that is equivalent to amplify the capacitor C by (1+gm2·R2) times.

Figure 4:
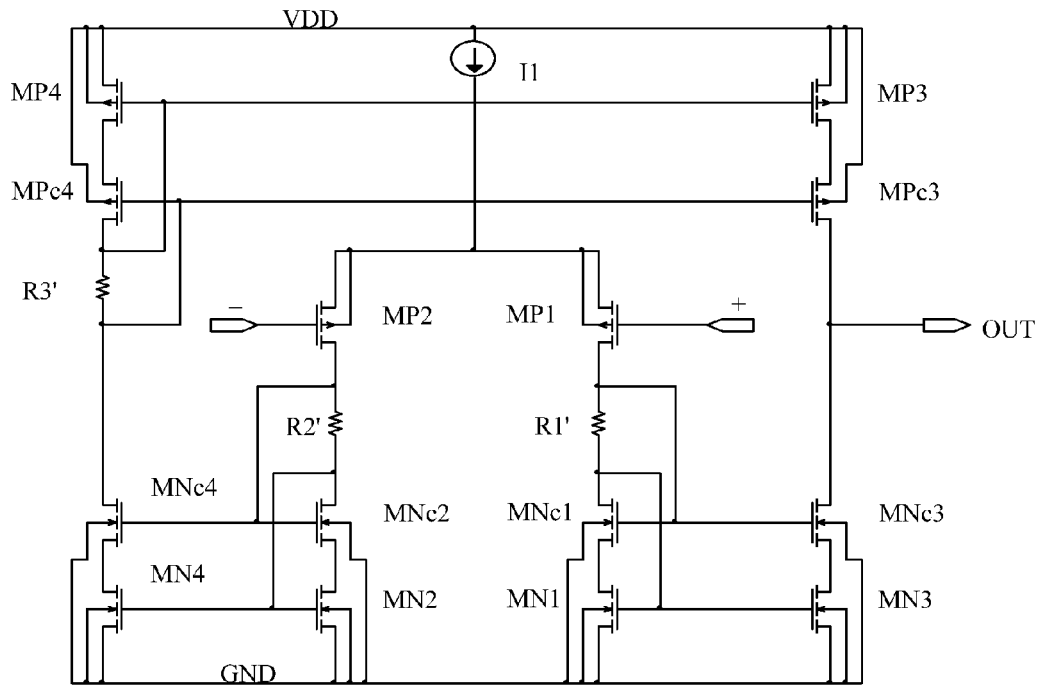
FIG. 4 is a circuit diagram showing an exemplary configuration of a transconductance amplifier according to one embodiment of the present invention.

The transconductance amplifier gm1 or gm2 with high output resistance generally no less than 1 mega ohm is preferred in the compensation circuit of the first and second embodiments for better compensation effect. If the output resistance of the transconductance amplifier is too small, a larger portion of current may flow to the ground via the output resistance. To a large extend, the compensation characteristic above mentioned may be changed thereby. There are many way to realize the transconductance amplifier with high output resistance. FIG. 4 shows an exemplary configuration of the transconductance amplifier gm1 or gm2 according to one embodiment of the present invention.

Referring to FIG. 4, the transconductance amplifier comprises PMOS transistors MP1, MP2, MP3, MP4, MPc3 and MPc4, NMOS transistors MN1, MN2, MN3, MN4, MNc1, MNc2, MNc3 and MNc4, resistors R1, R2' and R3', and a current source I1.

A gate of the PMOS transistor MP4 is coupled to a gate of the PMOS transistor MP3, and both a source of the PMOS transistor MP4 and a source of the PMOS transistor MP3 are coupled to a power supply VDD. A gate of the PMOS transistor MPc4 is coupled to a gate of the PMOS transistor MPc3, a source of the PMOS transistor MPc4 is coupled to a drain of the PMOS transistor MP4, and a source of the PMOS transistor MPc3 is coupled to a drain of the PMOS transistor MP3.

A gate of the NMOS transistor MN4 is coupled to a gate of the NMOS transistor MN2, a source of the NMOS transistor MN4 and a source of the NMOS transistor MN2 are coupled to a ground GND. A gate of the NMOS transistor MNc4 is coupled to a gate of the NMOS transistor MNc2, a source of the NMOS transistor MNc4 is coupled to a drain of the NMOS transistor MN4, and a source of the NMOS transistor MNc2 is coupled to a drain of the NMOS transistor MN2.

A gate of the NMOS transistor MN1 is coupled to a gate of the NMOS transistor MN3, a source of the NMOS transistor MN1 and a source of the NMOS transistor MN3 are coupled to the ground GND. A gate of the NMOS transistor MNc1 is coupled to a gate of the NMOS transistor MNc3, a source of the NMOS transistor MNc1 is coupled to a drain of the NMOS transistor MN1, and a source of the NMOS transistor MNc3 is coupled to a drain of the NMOS transistor MN3.

An input of the current source I1 is coupled to the power supply VDD, and an output of the current source I1 is coupled to a source of the PMOS transistor MP1 and a source of the PMOS transistor MP2.

A drain of the PMOS transistor MPc4 and a drain of the NMOS transistor MNc4 are connected through the resistor R3'. A drain of the PMOS transistor MP2 and a drain of the NMOS transistor MNc2 are connected through the resistor R2'. A drain of the PMOS transistor MP1 and a drain of the NMOS transistor MNc1 are connected through the resistor R1'. A drain of the PMOS transistor MPc3 is connected with a drain of the NMOS transistor MNc3. The gate of the PMOS transistor MPc4 is connected to the drain of the NMOS transistor MNc4, and the gate of the PMOS transistor MP4 is connected to the drain of the PMOS transistor MPc4. The gate of the NMOS transistor MNc4 is connected to the drain of the PMOS transistor MP2, and the gate of the NMOS transistor MN4 is connected to the drain of the NMOS transistor MNc2. The gate of the NMOS transistor MNc1 is connected to the drain of the PMOS transistor MP1, and the gate of the NMOS transistor MN1 is connected to the drain of the NMOS transistor MNc1.

A gate of the PMOS transistor MP1 functions as the inverse input of the transconductance amplifier, and a gate of the PMOS transistor MP1 functions as the non-inverse input of the transconductance amplifier. An intermediate nod between the drain of the PMOS transistor MPc3 and the drain of the NMOS transistor MNc3 functions as the output of the transconductance amplifier.

The output resistance of the transconductance amplifier is increased greatly by the NMOS transistor MNc3 and the PMOS transistor MPc3. The output resistance of the transconductance amplifier is $r_{O\_N3}//r_{O\_P3}$ when the transconductance amplifier doesn't comprise the NMOS transistor MNc3 and the PMOS transistor MPc3, wherein $r_{O\_N3}$ is an output resistance of the NMOS transistor MN3, and $r_{O\_P3}$ is an output resistance of the PMOS transistor MP3. The output resistance of the transconductance amplifier is $[(gm_{NC3} \cdot r_{O\_NC3}) \cdot r_{O\_N3}]//[(gm_{PC3} \cdot r_{O\_PC3}) \cdot r_{O\_P3}]$ when the NMOS transistor MNc3 and the PMOS transistor MPc3 are added, wherein $gm_{NC3}$ is a transconductance of the NMOS transistor MNc3, $r_{O\_NC3}$ is an output resistance of the NMOS transistor MNc3, $gm_{PC3}$ is a transconductance of the PMOS transistor MPc3, and $r_{O\_P3}$ is an output resistance of the PMOS transistor MPc3. In general, both $gm_{NC3} \cdot r_{O\_NC3}$ and $gm_{PC3} \cdot r_{O\_PC3}$ are larger than 10, so the output resistance of the transconductance amplifier is increased greatly.

Figure 5:
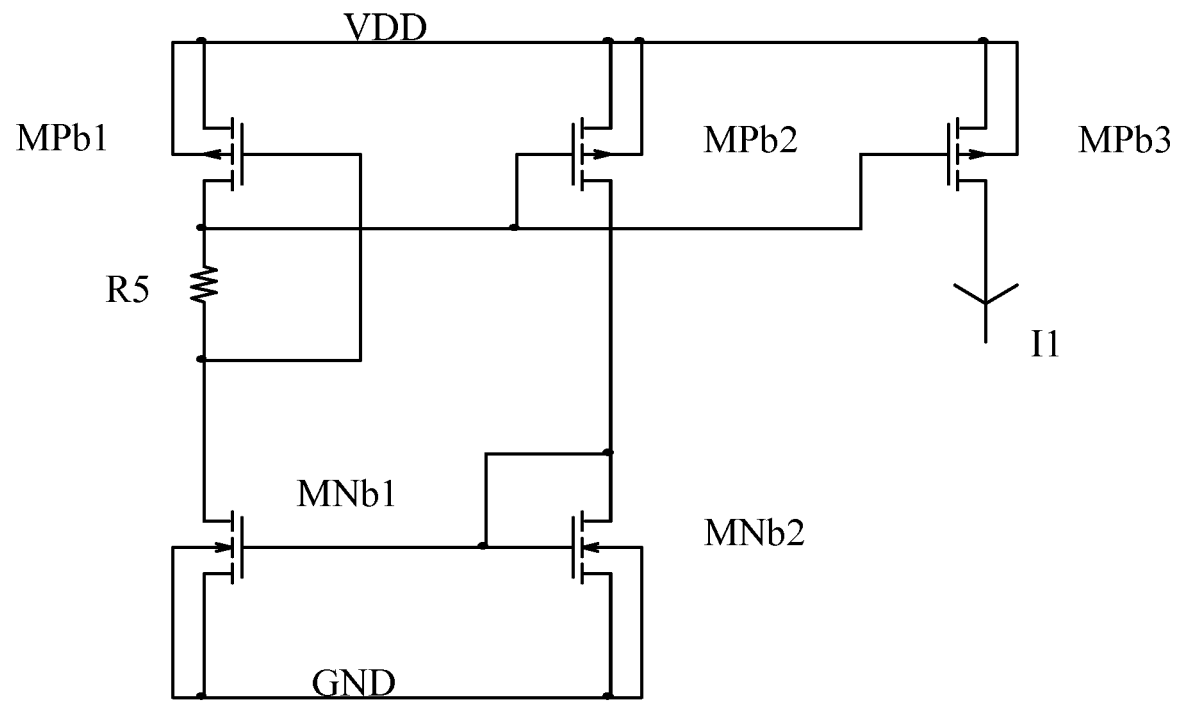
FIG. 5 is a circuit diagram showing an exemplary configuration of a current source shown in FIG. 4.

There are many way to realize the current source I1 shown in FIG. 4. FIG. 5 is a circuit diagram showing a preferred exemplary configuration of the current source I1.

Referring to FIG. 5, the current source comprises PMOS transistors MPb1, MPb2 and MPb3, NMOS transistors MNb1 and MNb2, and resistors R5.

Gates of the PMOS transistors MPb2 and MPb3 are coupled together, and sources of the PMOS transistors MPb1, MPb2 and MPb3 are coupled to the power supply VDD. Gates of the NMOS transistors MNb1 and MNb2 are coupled together, and sources of the NMOS transistors MNb1 and MNb2 are coupled to the ground GND. A drain of the PMOS transistors MPb1 is connected to a drain of the NMOS transistors MNb1 through the resistor R5, a gate of the PMOS transistors MPb1 is connected to the drain of the NMOS transistors MNb1, and the gate of the PMOS transistors MPb2 is connected to the drain of the PMOS transistors MPb1. A drain of the PMOS transistors MPb2 is coupled to a drain of the NMOS transistors MNb2, the gate of the NMOS transistors MNb2 is coupled to the drain of the NMOS transistors MNb2. A drain of the PMOS transistors MPb3 functions as the output of the current source.

An output current I of the current source shown in FIG. 5 satisfies:

$$I = \frac{\sqrt{\frac{2I}{\mu \cdot C_{OX} \cdot \left(\frac{W}{L}\right)_{b2}}} - \sqrt{\frac{2I}{\mu \cdot C_{OX} \cdot \left(\frac{W}{L}\right)_{b1}}}}{R5}. \quad (6)$$

where $$\left(\frac{W}{L}\right)_{b2}$$

is a ration to length of the PMOS transistors MPb2, $$\left(\frac{W}{L}\right)_{b1}$$

is a ratio of width to length of the PMOS transistors MPb1,
$\mu$ is a carrier mobility, $C_{OX}$ is a gate oxide capacitance per unit, $\mu$ and $C_{OX}$ are determined by production process.

Taking the square root of both sides of the formula (6), we obtain:

$$\sqrt{I} = \sqrt{\frac{\sqrt{\frac{2}{\mu \cdot C_{OX} \cdot \left(\frac{W}{L}\right)_{b2}}} - \sqrt{\frac{2}{\mu \cdot C_{OX} \cdot \left(\frac{W}{L}\right)_{b1}}}}{R5}} = \sqrt{\frac{\frac{2}{\mu \cdot C_{OX} \cdot \left(\frac{W}{L}\right)_{b2}}}{R5}} \cdot \left(1 - \sqrt{\frac{1}{N}}\right). \quad (7)$$

wherein N is a ratio of $$\left(\frac{W}{L}\right)_{b1} \text{ to } \left(\frac{W}{L}\right)_{b2},$$

R5 is a resistance of the resistor R5.

The transconductance gm2 of the transconductance amplifier shown in FIG. 4 is:

$$gm2 = \sqrt{2 \cdot I \cdot \mu \cdot C_{OX} \cdot \left(\frac{W}{L}\right)_1}. \quad (8)$$

where $$\left(\frac{W}{L}\right)_1$$

is a ratio of width to length of the PMOS transistor shown in FIG. 4.

Putting the formula (7) into the formula (8), we obtain:

$$gm2 = \frac{\frac{2}{\sqrt{M}} \cdot \left(1 - \frac{1}{\sqrt{N}}\right)}{R5}.$$

where M is a ratio of $$\left(\frac{W}{L}\right)_1 \text{ to } \left(\frac{W}{L}\right)_{b2}.$$

Hence, the amplification times of the capacitor in the first and second embodiments is:

$$1 + gm2 \cdot R2 = \frac{2}{\sqrt{M}} \cdot \left(1 - \frac{1}{\sqrt{N}}\right) \cdot \frac{R2}{R5}. \quad (8)$$

It can be seen that the application times only depends on M, N and R2/R5, wherein M and N have very small change because they are relative scale of the MOS transistor, and R2/R5 also has very change because it is relative scale likewise. Hence, the application times has very little change along with changes of production process. In other words, the application times of each chip in mass production has little change, so the stability of the compensation circuit is satisfied.

Figure 6:
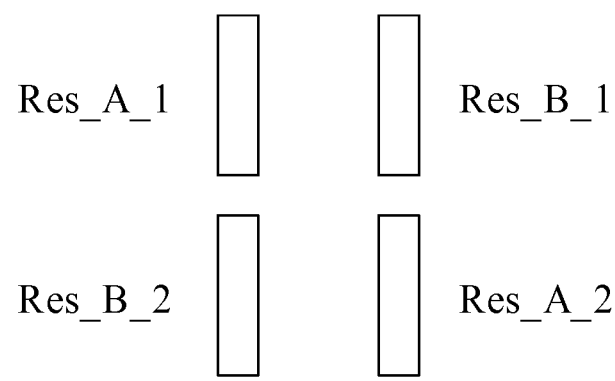
FIG. 6 is a schematic diagram showing an example of two resistors with concentric configuration.
Figure 7:
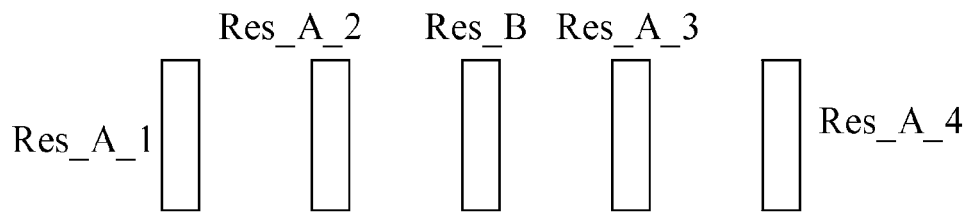
FIG. 7 is a schematic diagram showing another example of two resistors with concentric configuration.

In a preferred embodiment, the match between the resistor R2 shown in FIG. 2 or FIG. 3 and the resistor R5 should be considered in design, and the match among the PMOS transistors MPb1, MPb2 and MPb2 shown in FIG. 5 and the PMOS transistors MP1 and MP2 should also be considered in design. In layout design, two elements may match well when they are placed trimly and uniformly to be adjacent to each other by concentric way. FIG. 6 is a schematic diagram showing an example of two resistors with concentric configuration, wherein the resistor R_B are divided into two symmetrical parts R_B_1 and R_B_2, the resistor R_A are divided into two symmetrical parts R_A_1 and R_A_2, the symmetric centre of R_B_1 and R_B_2 coincide with the symmetric centre of R_A_1 and R_A_2. FIG. 7 is a schematic diagram showing another example of two resistors with concentric configuration.

Additionally, the values of the elements should be matched for better match effect. For example, the width of the PMOS transistor MPb2 equals to that of the PMOS transistor MPb3, and the length of the PMOS transistor MPb2 equals to that of the PMOS transistor MPb3; the width of the NMOS transistor MNb1 equals to that of the NMOS transistor MNb2, and the length of the NMOS transistor MNb1 equals to that of the NMOS transistor MNb2. As a result, the PMOS transistor MPb2 matches well with the PMOS transistor MPb3, and the NMOS transistor MNb2 matches well with the NMOS transistor MNb1.

When the voltage of the inverse input of the transconductance amplifier is equal to the voltage of the non-inverse input of the transconductance amplifier, the transconductance amplifier still output an error voltage Vos in practice, which is referred as the offset of the transconductance amplifier. The introduction of the transconductance amplifier gm2 further increases the offset of the compensation circuit. The offset $V_{OS2}$ of the transconductance amplifier gm2 becomes $V_{OS2}$·gm2/gm1 when being equivalent to the output of the transconductance amplifier gm1. As a result, the output offset of the improved compensation circuit becomes ($V_{OS1}$+ $V_{OS2}$·gm2/gm1). In a preferred embodiment, the value of gm1/gm2 should be increased as much as possible in design to reduce effect brought by the transconductance amplifier gm2. In general, gm1/gm2>1.

Figure 8:
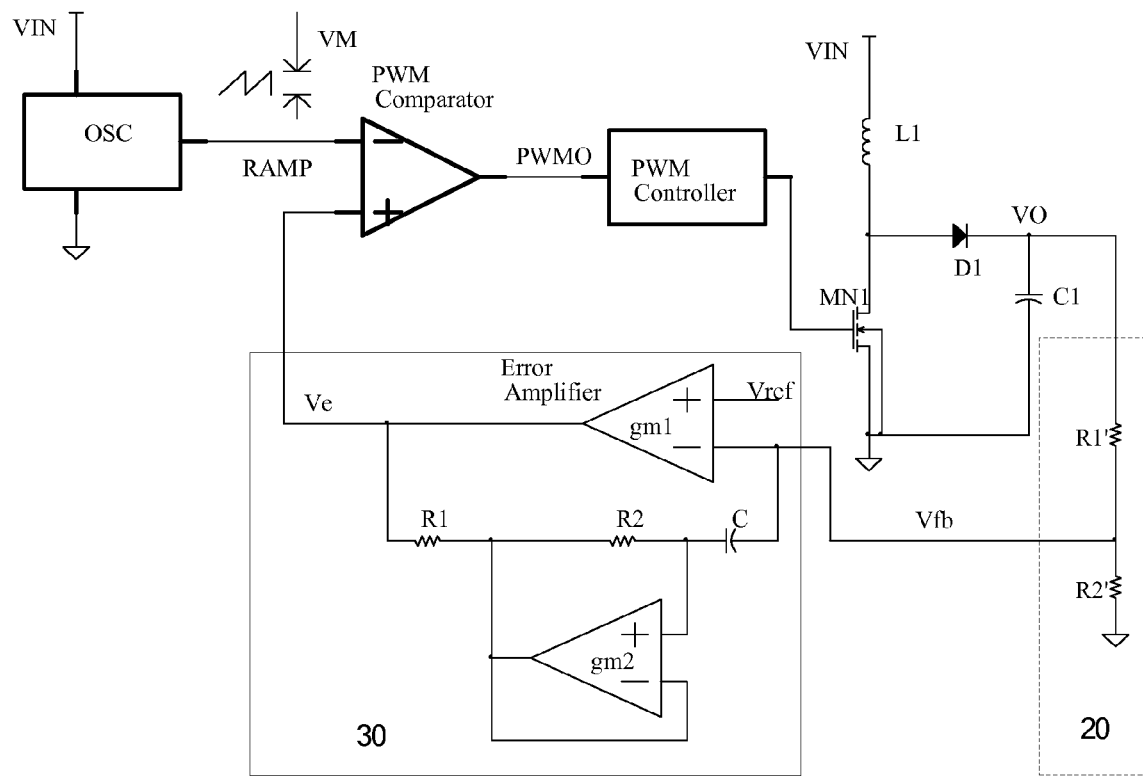
FIG. 8 is a circuit diagram showing a boost power converter comprising the compensation circuit shown in FIG. 2.

The compensation circuit of the present invention can be applied in various loop circuits. For example, the compensation circuit can be applied in a boost power converter. FIG. 8 is a circuit diagram showing a boost power converter comprising the compensation circuit shown in FIG. 2.

Referring to FIG. 8, the boost power converter comprises an oscillator OSC, a pulse width modulation (PWM) comparator, a PWM controller, a boost output circuit, a voltage divider and the compensation circuit shown in FIG. 2. The non-inverse input of the transconductance amplifier gm1 is coupled to the reference voltage Vr, the inverse input of the transconductance amplifier gm1 is coupled to a feedback voltage Vfb from the voltage diver, and the output of the transconductance amplifier gm1 is coupled to a non-inverse input of the PWM comparator. The transconductance amplifier gm1 is configured to amplify a voltage difference between the reference voltage Vr and the feedback voltage Vfb and output the difference voltage Ve to the PWM comparator. The oscillator OSC provides a ramp signal to an inverse input of the PWM comparator. The PWM comparator is configured to compare the difference voltage with the ramp signal to generate a PWM square wave signal with certain duty ratio. The boost output circuit comprises an inductor L1, a diode D1, a capacitor C1 and a boost switch. The PWM square wave signal is provided to drive the boost switch to boost an input voltage VIN to produce an output voltage VO. The voltage divider is configured to sense the output voltage VO to provide the feedback voltage Vfb. The feedback voltage Vfb is adjusted continuously via the negative feedback loop until it equal to the reference voltage Vr, thereby the boost power converter becomes stabilization.

The present invention has been described in sufficient details with a certain degree of particularity. It is understood to those skilled in the art that the present disclosure of embodiments has been made by way of examples only and that numerous changes in the arrangement and combination of parts may be resorted without departing from the spirit and scope of the invention as claimed. Accordingly, the scope of the present invention is defined by the appended claims rather than the foregoing description of embodiments.

What is claimed is:

1. A compensation circuit comprising:
   a first transconductance amplifier having an inverse input, a non-inverse input and an output;
   a first resistor having one terminal coupled to the output of the first transconductance amplifier;
   a capacitor connected with the first resistor in series, one terminal of the capacitor coupled to the inverse input of the first transconductance amplifier;
   a second resistor connected between the first resistor and the capacitor in series;
   a second transconductance amplifier having an inverse input, a non-inverse input and an output, the inverse input of the second transconductance amplifier coupled to the output of the second transconductance amplifier, the output of the second transconductance amplifier coupled to an intermediate node between the first resistor and the second resistor, and the non-inverse input of the second transconductance amplifier coupled to an intermediate node between the capacitor and the second resistor.

2. The compensation circuit according to claim 1, wherein an output resistance of the first transconductance amplifier or the second transconductance amplifier is not less than 1 mega ohm.

3. The compensation circuit according to claim 1, wherein a value of gm1/gm2 is larger than 1, and wherein
   gm1 is a transconductance value of the first transconductance amplifier; and
   gm2 is a transconductance value of the second transconductance amplifier.

4. The compensation circuit according to claim 1, wherein the first transconductance amplifier or the second transconductance amplifier comprises a current source comprising PMOS transistors MPb1, MPb2 and MPb3, NMOS transistors MNb1 and MNb2, and resistors R5, and wherein
   gates of the PMOS transistors MPb2 and MPb3 are coupled together, and sources of the PMOS transistors MPb1, MPb2 and MPb3 are coupled to a power terminal VDD;
   gates of the NMOS transistors MNb1 and MNb2 are coupled together, and sources of the NMOS transistors MNb1 and MNb2 are coupled to a ground terminal GND;
   a drain of the PMOS transistors MPb1 is connected to a drain of the NMOS transistors MNb1 through the resistor R5, a gate of the PMOS transistors MPb1 is connected to the drain of the NMOS transistors MNb1, and the gate of the PMOS transistors MPb2 is connected to the drain of the PMOS transistors MPb1;
   a drain of the PMOS transistors MPb2 is coupled to a drain of the NMOS transistors MNb2, the gate of the NMOS transistors MNb2 is coupled to the drain of the NMOS transistors MNb2; and
   a drain of the PMOS transistors MPb3 functions as the output of the current source.

5. The compensation circuit according to claim 4, wherein a width of the PMOS transistor MPb2 equals to that of the PMOS transistor MPb3, and a length of the PMOS transistor MPb2 equals to that of the PMOS transistor MPb3; and a width of the NMOS transistor MNb1 equals to that of the NMOS transistor MNb2, and a length of the NMOS transistor MNb1 equals to that of the NMOS transistor MNb2.

6. A compensation circuit, comprising:
a first transconductance amplifier having an inverse input, a non-inverse input and an output;
a first resistor having one terminal coupled to the output of the first transconductance amplifier;
a second resistor connected with the first resistor in series, one terminal coupled to the inverse input of the first transconductance amplifier;
a capacitor connected between the first resistor and the second resistor in series;
a second transconductance amplifier having an inverse input, a non-inverse input and an output, the inverse input of the second transconductance amplifier coupled to the output of the second transconductance amplifier, the output of the second transconductance amplifier coupled to an intermediate node between the second resistor and the capacitor, and the non-inverse input of the second transconductance amplifier coupled to the inverse input of the first transconductance amplifier.

7. The compensation circuit according to claim 6, wherein an output resistance of the first transconductance amplifier or the second transconductance amplifier is not less than 1 mega ohm.

8. The compensation circuit according to claim 6, wherein a value of gm1/gm2 is larger than 1, and wherein
gm1 is a transconductance value of the first transconductance amplifier; and
gm2 is a transconductance value of the second transconductance amplifier.

9. The compensation circuit according to claim 6, wherein the first transconductance amplifier or the second transconductance amplifier comprises a current source comprising PMOS transistors MPb1, MPb2 and MPb3, NMOS transistors MNb1 and MNb2, and resistors R5, and wherein
gates of the PMOS transistors MPb2 and MPb3 are coupled together, and sources of the PMOS transistors MPb1, MPb2 and MPb3 are coupled to a power terminal VDD;
gates of the NMOS transistors MNb1 and MNb2 are coupled together, and sources of the NMOS transistors MNb1 and MNb2 are coupled to a ground terminal GND;
a drain of the PMOS transistors MPb1 is connected to a drain of the NMOS transistors MNb1 through the resistor R5, a gate of the PMOS transistors MPb1 is connected to the drain of the NMOS transistors MNb1, and the gate of the PMOS transistors MPb2 is connected to the drain of the PMOS transistors MPb1;
a drain of the PMOS transistors MPb2 is coupled to a drain of the NMOS transistors MNb2, the gate of the NMOS transistors MNb2 is coupled to the drain of the NMOS transistors MNb2; and
a drain of the PMOS transistors MPb3 functions as the output of the current source.

10. The compensation circuit according to claim 9, wherein
a width of the PMOS transistor MPb2 equals to that of the PMOS transistor MPb3, and a length of the PMOS transistor MPb2 equals to that of the PMOS transistor MPb3; and
a width of the NMOS transistor MNb1 equals to that of the NMOS transistor MNb2, and a length of the NMOS transistor MNb1 equals to that of the NMOS transistor MNb2.

* * * * *